United States Patent
Kawamura

(10) Patent No.: US 7,586,754 B2
(45) Date of Patent: Sep. 8, 2009

(54) PRINTED WIRING BOARD AND PROCESS FOR MANUFACTURING THE SAME

(75) Inventor: Yoshihiro Kawamura, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 183 days.

(21) Appl. No.: 11/806,894

(22) Filed: Jun. 5, 2007

(65) Prior Publication Data

US 2008/0037233 A1   Feb. 14, 2008

(30) Foreign Application Priority Data

Aug. 8, 2006   (JP)   ............................. 2006-215663

(51) Int. Cl.
  *H05K 7/10*   (2006.01)
(52) U.S. Cl. ...................... 361/767; 361/762; 361/765; 361/768; 361/807; 361/808; 361/810; 361/812; 174/259; 174/263; 174/260; 174/267
(58) Field of Classification Search .................. 361/767, 361/748–751, 760, 761, 762, 765, 768, 790–795, 361/807, 808, 810, 812; 174/259, 260–267
  See application file for complete search history.

(56) References Cited

U.S. PATENT DOCUMENTS

| | | | | |
|---|---|---|---|---|
| 5,362,927 | A | * | 11/1994 | Ezaki .......................... 174/261 |
| 6,075,290 | A | * | 6/2000 | Schaefer et al. ............. 257/737 |
| 6,329,610 | B1 | * | 12/2001 | Takubo et al. ............... 174/264 |
| 6,388,201 | B2 | * | 5/2002 | Yamato et al. .............. 174/255 |
| 7,095,116 | B1 | * | 8/2006 | Kelkar et al. ................ 257/737 |
| 7,408,241 | B2 | * | 8/2008 | Bauer et al. ................. 257/623 |
| 7,465,885 | B2 | * | 12/2008 | Chi et al. .................... 174/260 |
| 2003/0184986 | A1 | * | 10/2003 | Soga et al. .................. 361/767 |
| 2005/0012216 | A1 | * | 1/2005 | Leong et al. ................ 257/751 |
| 2005/0145412 | A1 | * | 7/2005 | Chi et al. .................... 174/250 |
| 2006/0237855 | A1 | * | 10/2006 | Kroehnert et al. ........... 257/779 |

FOREIGN PATENT DOCUMENTS

| | | |
|---|---|---|
| JP | 6-44177 | 6/1994 |
| JP | 10-270812 | 10/1998 |
| JP | 11-251728 | 9/1999 |
| JP | 2000-346421 | 12/2000 |

* cited by examiner

*Primary Examiner*—Tuan T Dinh
*Assistant Examiner*—Hoa C Nguyen
(74) *Attorney, Agent, or Firm*—Kratz, Quintos & Hanson, LLP

(57) ABSTRACT

The printed wiring board includes: a conductive wiring which is formed on a surface of a board and has a plurality of solder lands, to which components to be mounted are electrically connected by solder; and first and second electrically insulating layers formed on the conductive wiring, wherein the first insulating layer is formed on the conductive wiring in such a manner that the first insulating layer covers a portion of a peripheral part of one solder land and a central part of the one solder land is exposed, the portion of the peripheral part being situated on the side of another solder land, wherein the second insulating layer is piled up on the first insulating layer which covers the portion of the peripheral part of the one solder land.

3 Claims, 5 Drawing Sheets

PRINTED WIRING BOARD AND PROCESS FOR MANUFACTURING THE SAME

BACKGROUND OF THE INVENTION (1) Field of the Invention

The present invention relates to a printed wiring board and a process for manufacturing a printed wiring board, in particular, a printed wiring board including: a conductive wiring, which is formed on a surface of a board and has a solder land to which components to be mounted are electrically connected by solder; and a first electrically insulating layer formed on the conductive wiring, and a process for manufacturing such a printed wiring board.

(2) Description of the Related Art

As an example of a conventional printed wiring board, for example, a printed wiring board shown in FIG. 5 has been proposed. As shown in FIG. 5, the printed wiring board includes a board 10 and a conductive wiring 11 formed on a surface of the board 10. The conductive wiring 11 includes solder lands 16, to which electric components 12, 13, 14 are electrically connected by solder 15.

A resist film 17 as the first insulating layer is formed on a part of the conductive wiring 11, wherein the solder lands 16 is not formed on said part of the conductive wiring 11. There is a distance L between the solder land 16 of the electric component 12 and that of the electric component 13 so that the electric components 12 and 13 are electrically insulated from each other.

However, the distance L must be a certain length so as to secure electrical insulation, which causes a problem that a size of the printed wiring board cannot be decreased.

In this connection, flux is used in the soldering process for the purposed of preventing re-oxidation during the soldering and of decreasing surface tension of molten solder. In this case, there might be a problem that the flux remains between the conductive wiring 11 to be connected to the electric component 12 and the conductive wiring 11 to be connected to the electric component 13, that is, a flux residue 18 takes place.

Due to the flux residue 18, even if the distance L is provided upon designing so as to assure the electrical insulation between the electric components 12 and 13, there might be a problem that such insulation between the electric components 12 and 13 is deteriorated due to influence of high temperature-high humidity or humidity upon applying high voltage.

For solving the above problem, as shown in FIG. 6, there is an idea that a hole 19 is provided in a board 10 situated between the conductive wiring 11 to be connected to the electric component 12 and the conductive wiring 11 to be connected to the electric component 13. However, in this case, it is not possible to provide the electric component 14 on the rear side of the electric components 12 and 13 because of the hole 19, causing a problem that a high-density mounting cannot be realized.

As shown in FIG. 7, there is an idea that a silk 20 is provided on a board 10 situated between the conductive wiring 11 to be connected to the electric component 12 and the conductive wiring 11 to be connected to the electric component 13. However, there is a possibility that the flux residue 18 takes place on the silk 20, causing a problem.

As shown in FIG. 8A, there is an idea that the resist film 17 is formed to cover the periphery of the solder land 16 (Japanese Patent Application Laid-Open No. H11-251728). In this case, since there is a step between the solder land 16 and the resist film 17, therefore the flux never climbs over the resist film 17 to spread. Moreover, the insulation distance between the solder lands 16 becomes longer due to the step. Therefore, the distance L between the electric components 12 and 13 can be small owing to the step, so that a size of the printed wiring board can be decreased.

However, since there is the step between the solder land 16 and the board 10, the resist film 17 provided on the periphery of the solder land 16 is thinner than the resist film 17 located on the board 10. Further, since there is a possibility that a pin-hole takes place on the resist film 17, a short insulation distance cannot be sufficiently attained even if the step is provided. Moreover, the flux might climb over the resist film 17.

For solving these problems, as shown in FIG. 8B, it has been proposed that a thick resist film 17 is provided. However, it is very difficult to form a thick resist film 17 with a general method and there is a problem in terms of a cost.

As described in Japanese Utility Model Application Laid-Open No. 6-44177, Japanese Patent Application Laid-Open No. H10-270812 and Japanese Patent Application Laid-Open No. 2000-346421, so far there have been various measures to attain the electrical insulation between the conductive wirings 11. However, there has been no proposal as to a method of attaining electrical insulation between the solder lands 16.

SUMMARY OF THE INVENTION

It is therefore an objective of the present invention to solve the above problems and to provide a printed wiring board and a process for manufacturing a printed wiring board, by which the electrical insulation between the solder lands, on which the components to be mounted are mounted, can be securely attained with a low cost.

In order to attain the above objective, the present invention is to provide a printed wiring board including: a conductive wiring which is formed on a surface of a board and has a plurality of solder lands, to which components to be mounted are electrically connected by solder; and first and second electrically insulating layers formed on the conductive wiring, wherein the first insulating layer is formed on the conductive wiring in such a manner that the first insulating layer covers a portion of a peripheral part of one solder land and a central part of the one solder land is exposed, said portion of the peripheral part being situated on the side of another solder land, wherein the second insulating layer is piled up on the first insulating layer which covers the portion of the peripheral part of the one solder land.

With the construction described above, by providing the first insulating layer, a step between the peripheral part of the solder land and the board becomes small and an edge of the peripheral part becomes round, therefore a thickness of the second insulating layer to be piled up on the first insulating layer can be set large. Thereby, electrical insulation between the solder lands can be clearly ensured and a flux of the solder can be securely prevented from spreading beyond the second insulating layer to the outside of the solder land. Therefore, the electrical insulation between the solder lands, on which electric components are mounted, can be ensured with low cost and with a small size construction.

The second insulating layer is formed by silk-screen printing.

With the construction described above, the second insulating layer also can be formed when a terminal number and electric component number are printed on the board by silk-screen printing, therefore the electrical insulation between the solder lands, on which electric components are mounted, can be ensured with low cost and without increasing manufacturing steps.

In order to attain the above objective, the present invention is also to provide a process for manufacturing a printed wiring board which includes: a conductive wiring which is formed on a surface of a board and has a plurality of solder lands, to which components to be mounted are electrically connected by solder; and first and second electrically insulating layers formed on the conductive wiring, said process including in turn the steps of: forming the conductive wiring on the surface of the board; forming the first insulating layer on the conductive wiring in such a manner that the first insulating layer covers a portion of a peripheral part of one solder land and a central part of the one solder land is exposed, said portion of the peripheral part being situated on the side of another solder land; forming the second insulating layer by piling up on the first insulating layer which covers the portion of the peripheral part of the one solder land; and mounting a component to be mounted on the central part of the one solder land and electrically connecting the component to the one solder land by solder.

With the construction described above, the step, in which the component to be mounted is mounted on the central part of the one solder land and electrically connected to the one solder land by solder, is carried out after the step, in which the second insulating layer is formed by piling up on the first insulating layer which covers the portion of the peripheral part of the one solder land. Therefore, a flux of the solder can be securely prevented from spreading beyond the second insulating layer to the outside of the solder land. Therefore, the electrical insulation between the solder lands, on which electric components are mounted, can be ensured with low cost.

DESCRIPTION OF THE PREFERRED EMBODIMENTS

In the following, a preferred embodiment of the present invention will be explained with reference to the attached drawings.

Figure 1:
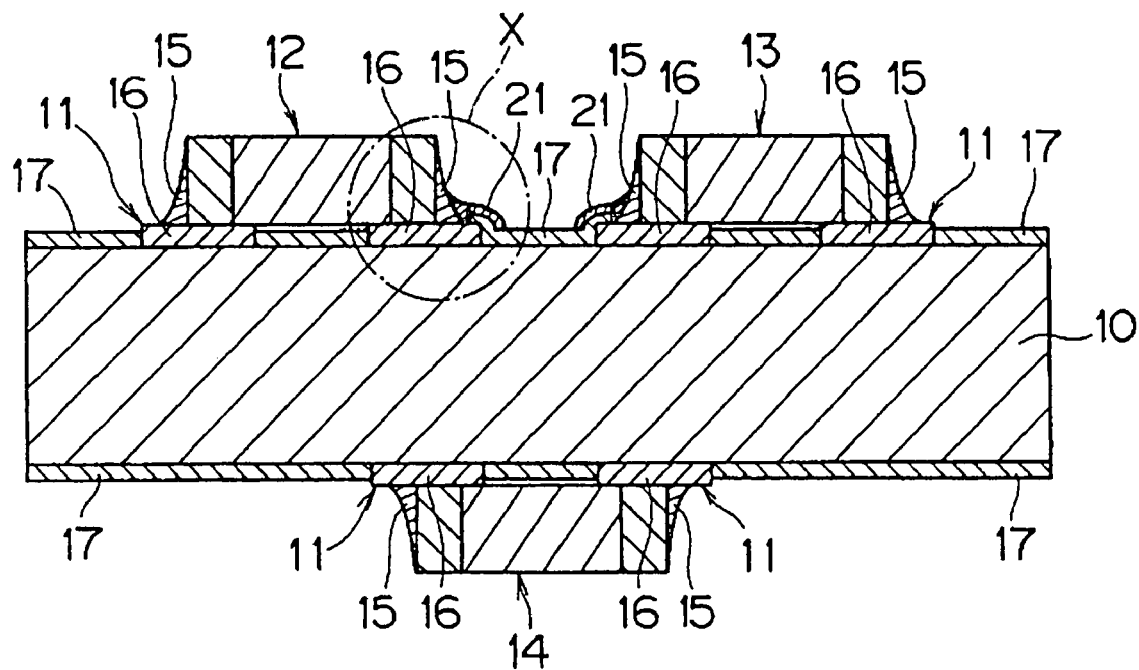
FIG. 1 is a cross-sectional view illustrating a preferred embodiment of a printed wiring board according to the present invention.
Figure 2:
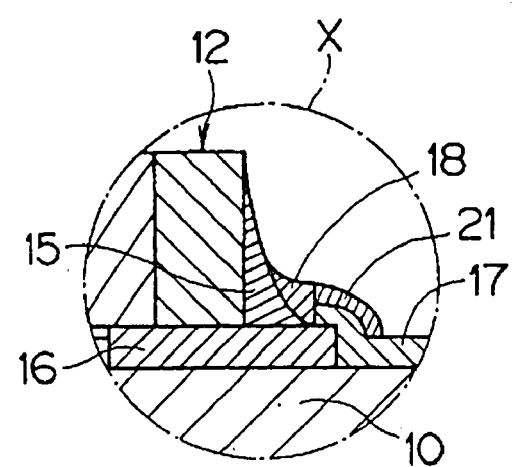
FIG. 2 is an enlarged cross-sectional view of an X part of the printed wiring board shown in FIG. 1.
Figure 3:
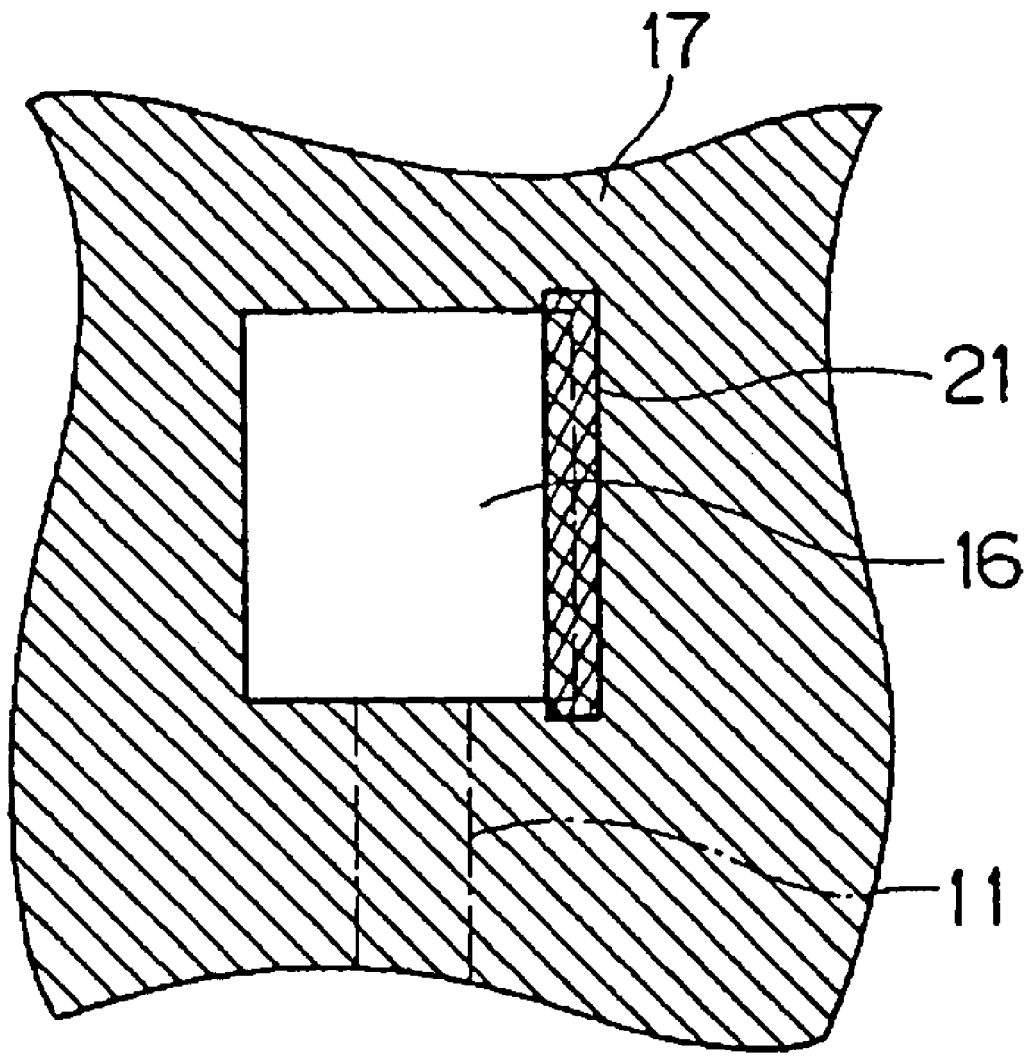
FIG. 3 is a partial cross-sectional view illustrating a printed wiring board before mounting components to be mounted.

As shown in FIGS. 1-3, a printed wiring board includes a board 10 and a conductive wiring 11 formed on a top surface and an under surface of the board 10. The conductive wiring 11 includes solder lands 16 to which a plurality of components 12, 13, 14 to be mounted are electrically connected by solder 15. The solder land 16 is formed wider than the other part of the conductive wiring 11 so that the soldering is carried out easily.

The components 12, 13 are arranged on the side of the top surface of the board 10. The components 12, 13 are arranged near to each other and must be electrically insulated from each other. The component 14 is arranged on the side of the under surface of the board 10. There is no other component to be mounted being arranged in the proximity of the component 14, from which other component the component 14 must be electrically insulated.

The printed wiring board includes an electrically insulating resist film 17 (the first insulating layer) formed on the conductive wiring 11. The insulating resist film 17 formed on the conductive wiring 11, which is formed on the top surface of the board 10, is provided in a region designated by diagonal lines running from left upper to right lower in FIG.

The resist film 17 is formed on the conductive wiring 11 in such a manner that the resist film 17 covers a portion of a peripheral part of a solder land 16 (the one solder land), to which the component 12 is connected, and a central part of the solder land 16 is exposed, said portion of the peripheral part being situated on the side of the solder land 16 (the other solder land), to which the component 13 is connected. Concretely, the resist film 17 is formed so as to cover one edge part of the peripheral part of the solder land 16, to which the component 12 is connected, said one edge part being situated on the side of the component 13.

Moreover, the resist film 17 is formed on the conductive wiring 11 in such a manner that the resist film 17 covers a portion of a peripheral part of a solder land 16 (the one solder land), to which the component 13 is connected, and a central part of the solder land 16 is exposed, said portion of the peripheral part being situated on the side of the solder land 16 (the other solder land), to which the component 12 is connected. Concretely, the resist film 17 is formed so as to cover one edge part of the peripheral part of the solder land 16, to which the component 13 is connected, said one edge part being situated on the side of the component 12.

That is, the resist film 17 covers the peripheral part of the solder land 16 so as to prevent a flux of the solder from flowing from the solder land 16, to which the component 12 (or component 13) is connected, to the solder land 16, to which the component 13 (or component 12) is connected. Further, the resist film 17 covers the peripheral parts of the respective solder lands 16 so as to elongate an insulation distance between the solder lands 16.

On the other hand, the resist film 17 formed on the conductive wiring 11 provided on the under surface of the board 10 is provided on the conductive wiring 11 except a region where the solder lands 16 are provided.

The printed wiring board includes a silk layer 21 as the second insulating layer, which is piled up on the resist film 17 which covers the peripheral part of the solder land 16. The silk layer 21 is provided by silk-screen printing an electrically insulating ink. The silk layer 21 is provided in a region designated by diagonal lines running from left lower to right upper in FIG. 3. The components 12 and 13 are mounted on the respective central parts of the solder lands 16. The components 12 and 13 are electrically connected to the respective central parts of the solder lands 16 by the solder 15.

Figure 4A:
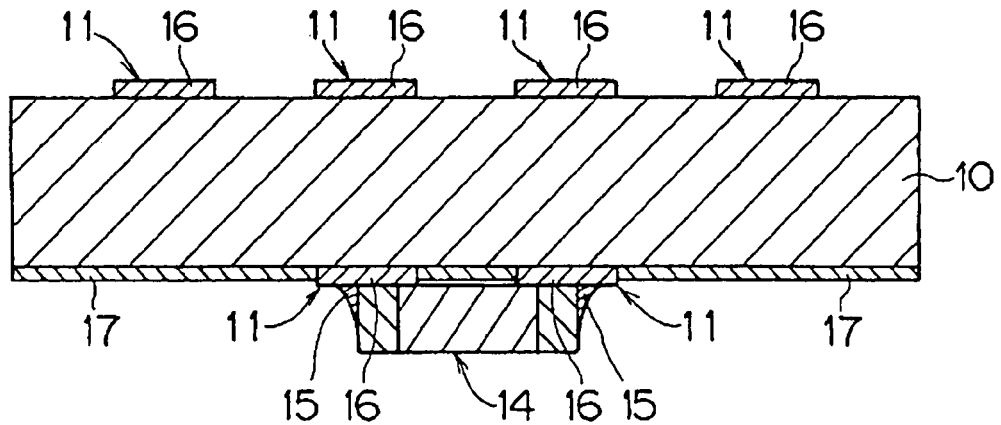
FIGS. 4A-4C are cross-sectional views illustrating a process for manufacturing the printed wiring board shown in FIG. 1.

In the following, a process for manufacturing the printed wiring board having a structure described above will be explained with reference to FIGS. 4A-4C. As shown in FIG. 4A, first, the conductive wiring 11 is formed on the insulating board 10.

In this step of forming the conductive wiring 11, for example, an electrically conductive thin metal foil is formed over the whole surface of the board 10. Thereafter, a corrosion-resistible resin film is formed on the thin metal foil in a shape of the conductive wiring 11. As a method of providing the resin film, for example, there are methods of photography using photosensitive resin and of silk-screen printing. Thereafter, the board 10 is immersed in a corrosive liquid, so that a part of the thin metal foil which part is not covered with the corrosion-resistible resin film is dissolved in the corrosive liquid and removed, thereby the conductive wiring 11 is formed.

Figure 4B:
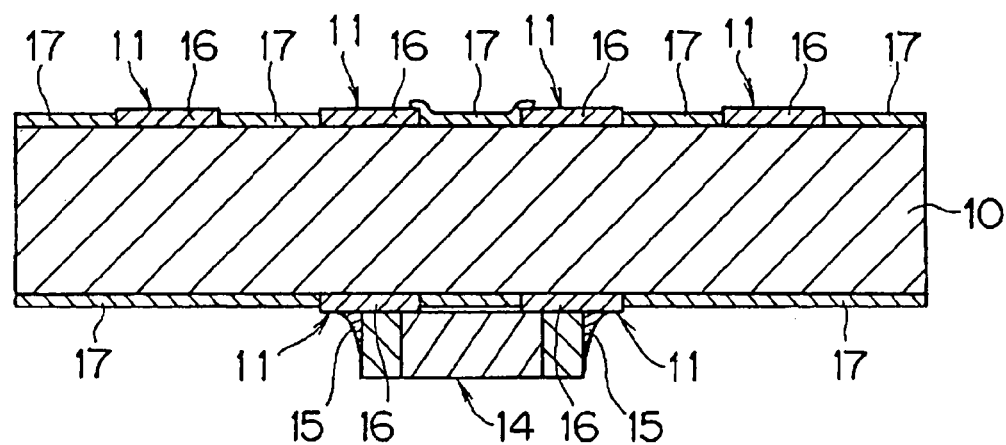

Then, as shown in FIG. 4B, the resist film 17 is formed on the conductive wiring 11 so that resist film 17 covers one edge part of the peripheral part of the solder land 16 and the central part of the solder land 16 is exposed.

In the step of forming the resist film 17, for example, a mask is placed on the central part of the solder land 16 and thereafter, a coating liquid of the resist film 17 is dropped on the board 10. Thereafter, the board 10 is subjected to high speed rotation so as to spread the coating liquid over the board 10 by means of centrifugal force, so that the resist film 17 is formed on the surface of the board 10. Thereafter, the mask is removed from the central part of the solder land 16.

Since there is a step between the solder land 16 and the board 10, the coating liquid coated on the peripheral part of the solder land 16 tends to flow easily. Therefore, the resist film 17 formed on the peripheral part of the solder land 16 becomes thinner than the resist film 17 formed on the board 10. That is, if nothing is carried out further, the flux of the solder easily climbs over the resist film 17 and flows out.

Figure 4C:
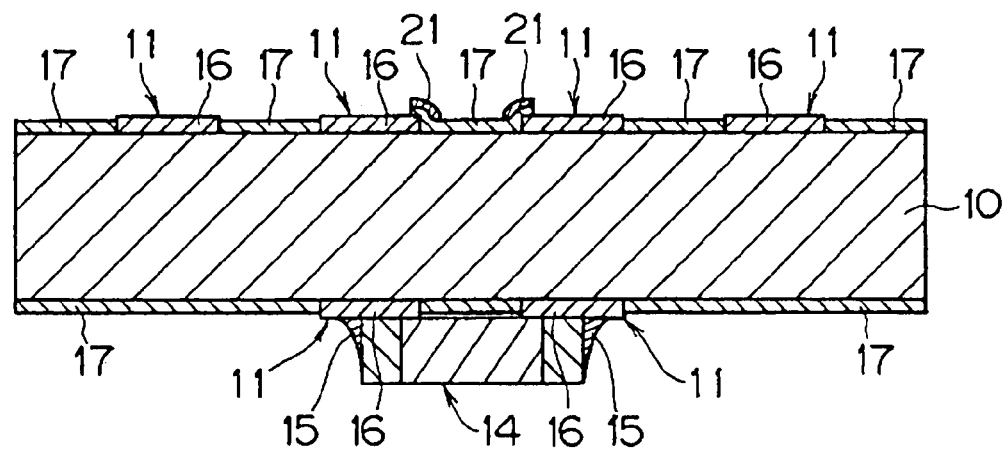
Figure 5:
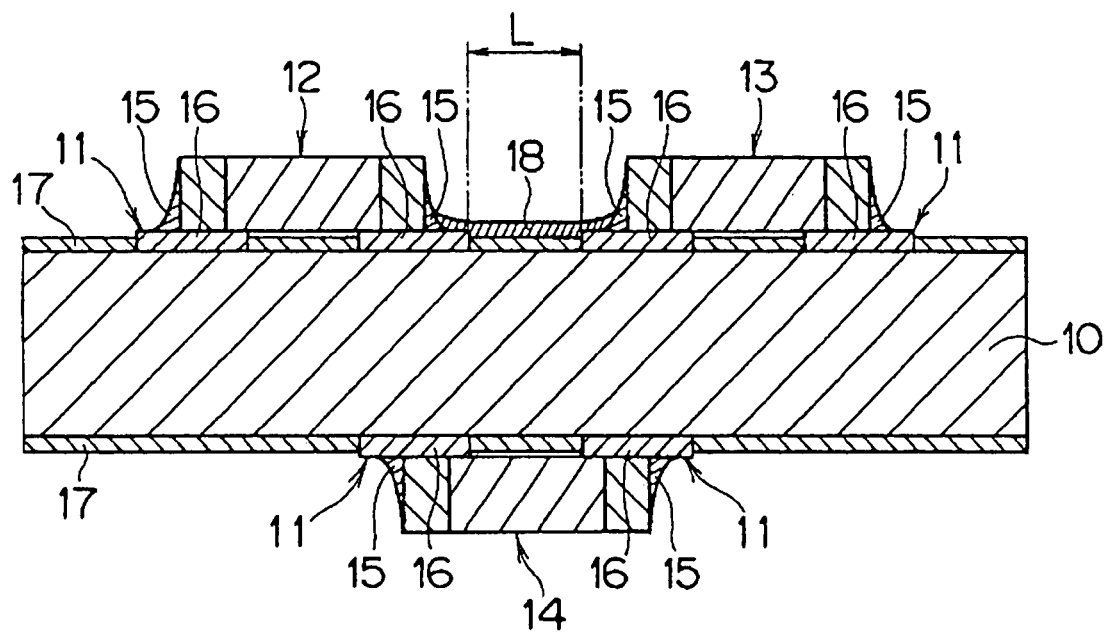
FIG. 5 is a cross-sectional view illustrating an example of a conventional printed wiring board.
Figure 6:
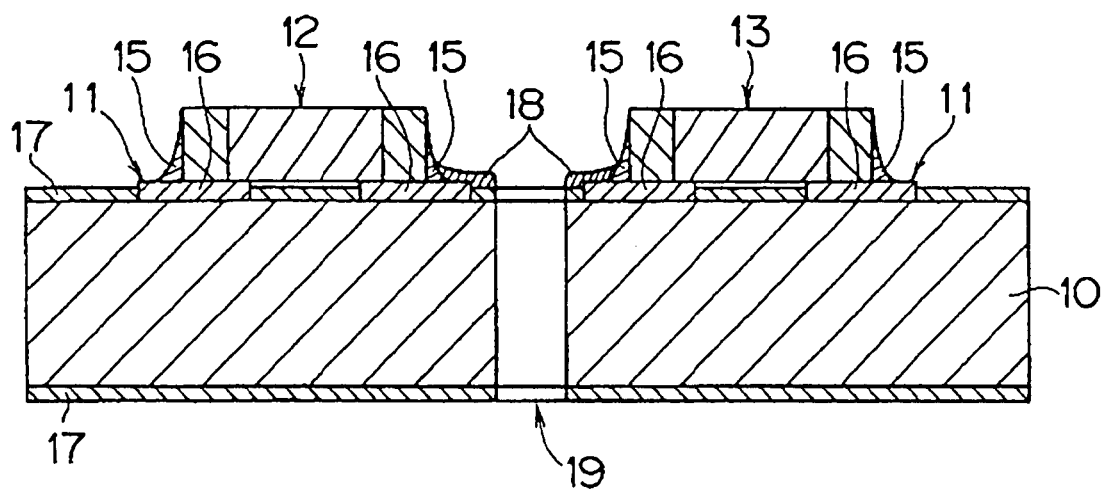
FIG. 6 is a cross-sectional view illustrating an example of a conventional printed wiring board.
Figure 7:
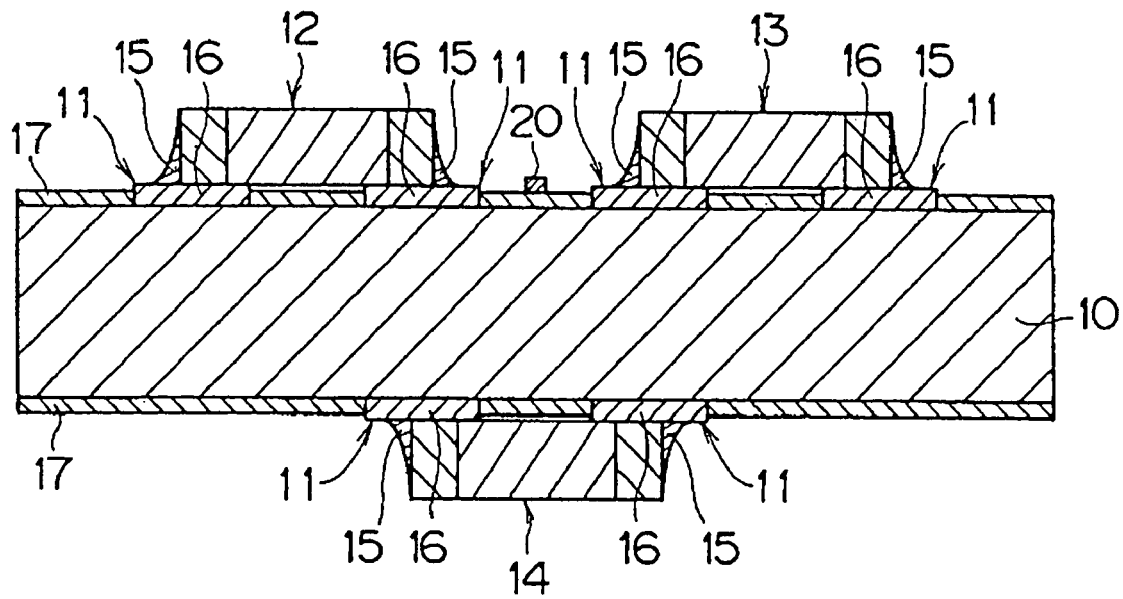
FIG. 7 is a cross-sectional view illustrating an example of a conventional printed wiring board.
Figure 8A:
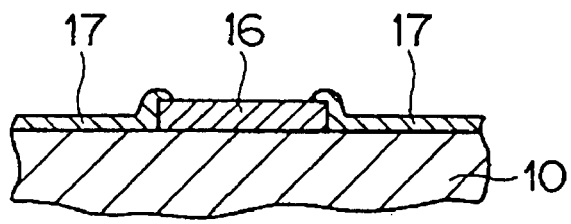
FIGS. 8A and 8B are partial cross-sectional views illustrating examples of a conventional printed wiring board.
Figure 8B:
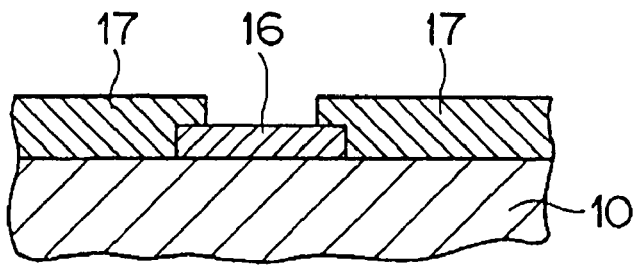

Therefore, as shown in FIG. 4C, the silk layer 21 is formed by piling up on the resist film 17 which covers the peripheral part of the solder land 16. This step of forming the silk layer 21 is carried out by means of silk-screen printing. In this connection, this step of forming the silk layer 21 is simultaneously carried out in a step of printing a terminal number and component number on the board 10 by means of silk-screen printing using a silk-screen printing apparatus.

The step between the peripheral part of the solder land 16 and the board 10 becomes small because of providing the resist film 17, and the edge of the peripheral part becomes round, therefore a thickness of the silk layer 21 can be set large. Thereafter, as shown in FIG. 1, the components 12 and 13 are mounted on the central part of the respective solder lands 16 and electrically connected to the respective solder lands 16 by the solder 15.

According to the printed wiring board described above, the resist film 17 is formed on the conductive wiring 11 in such a manner that the resist film 17 covers an edge part of the peripheral part of the solder land 16 and the central part of the solder land 16 is exposed and then, the silk layer 21 is formed by piling up on the resist film 17 which covers the peripheral part of the solder land 16. Thereby, a wall surrounding the central part of the solder land 16 becomes high because of the thickness of the silk layer 21, so that the flux of the solder can be securely prevented from climbing over the silk layer 21 to spread outside the solder land 16, and as shown in FIG. 2, flux residue 18 stays on the solder land 16. Furthermore, the insulation between the solder lands 16 can be further ensured because of the thickness of the silk layer 21. That is, the electrical insulation between the solder lands 16, on which electric components 12, 13 are mounted, can be ensured with low cost and with a small size construction.

According to the printed wiring board described above, since the silk layer 21 is formed by silk-screen printing, therefore the silk layer 21 can be formed simultaneously when the terminal number and component number is printed on the board 10 by silk-screen printing. Therefore, the electrical insulation between the solder lands 16 can be ensured with low cost and without increasing manufacturing steps.

According to the process for manufacturing a printed wiring board described above, the mounting of the components is carried out after the formation of the silk layer 21, therefore the flux of the solder can be securely prevented from climbing over the silk layer 21 to spread outside the solder land 16 and therefore, the electrical insulation between the solder lands 16, on which electric components 12, 13 are mounted, can be ensured with low cost.

In the preferred embodiment described above, the silk layer 21 is formed by silk-screen printing. However, instead, for example, the silk layer 21 may be formed by the same method by which the resist film 17 is formed, provided that the silk layer 21 is an electrically insulating layer.

In the preferred embodiment described above, the resist film 17 is formed so as to cover a portion of a peripheral part of the solder land 16. However, instead, for example, the resist film 17 may be formed so as to cover the whole peripheral part of the solder land 16.

In the preferred embodiment described above, the one solder land is set to be one of the solder lands 16 which are connected to the two components 12 and 13, while the other solder land 16 is set to be the other of the solder lands 16 which are connected to the two components 12 and 13. However, instead, for example, the one solder land and the other solder land may be set to be one and the other of two solder lands which are connected to one component, respectively.

The aforementioned preferred embodiments are described to aid in understanding the present invention and variations may be made by one skilled in the art without departing from the spirit and scope of the present invention.

What is claimed is:

1. A printed wiring board comprising:
   a conductive wiring which is formed on a surface of a board and has a plurality of solder lands, to which components to be mounted are electrically connected by solder; and
   first and second electrically insulating layers formed on the conductive wiring,
   wherein the first insulating layer is formed on the conductive wiring in such a manner that the first insulating layer covers a portion of a peripheral part of one solder land and a central part of the one solder land is exposed, said first insulating layer extending from one edge portion of said one solder land to another edge portion of another solder land, and
   wherein the second insulating layer is piled up on the first insulating layer which covers the portion of the peripheral part of the one solder land, but not completely covering said first insulating layer.

2. The printed wiring board according to claim 1, wherein the second insulating layer includes a silk layer.

3. A process for manufacturing a printed wiring board which includes:
   a conductive wiring which is formed on a surface of a board and has a plurality of solder lands, to which components to be mounted are electrically connected by solder; and
   first and second electrically insulating layers formed on the conductive wiring,
   said process comprising in turn the steps of:
   forming the conductive wiring on the surface of the board;
   forming the first insulating layer on the conductive wiring in such a manner that the first insulating layer covers a portion of a peripheral part of one solder land and a central part of the one solder land is exposed, said first insulating layer extending from one edge portion of said one solder land to another edge portion of another solder land;
   forming the second insulating layer by piling up on the first insulating layer which covers the portion of the peripheral part of the one solder land, but not completely covering the first insulating layer; and
   mounting a component to be mounted on the central part of the one solder land and electrically connecting the component to the one solder land by solder.

* * * * *